(12) United States Patent
Chen

(10) Patent No.: US 12,191,760 B2
(45) Date of Patent: Jan. 7, 2025

(54) PULSE WIDTH MODULATION CIRCUIT

(71) Applicant: TEXAS INSTRUMENTS INCORPORATED, Dallas, TX (US)

(72) Inventor: Huihuang Chen, Shenzhen (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 261 days.

(21) Appl. No.: 18/046,966

(22) Filed: Oct. 17, 2022

(65) Prior Publication Data

US 2024/0128859 A1  Apr. 18, 2024

(51) Int. Cl.
*H03K 7/08* (2006.01)
*H02M 1/42* (2007.01)
*H02M 3/156* (2006.01)
*H02M 3/157* (2006.01)

(52) U.S. Cl.
CPC ............ *H02M 1/4208* (2013.01); *H03K 7/08* (2013.01); *H02M 3/156* (2013.01); *H02M 3/157* (2013.01)

(58) Field of Classification Search
CPC ......... H02M 3/156; H02M 3/157; H03K 7/08
See application file for complete search history.

(56) References Cited

U.S. PATENT DOCUMENTS

| 6,421,381 | B1* | 7/2002 | Raghavan | H04L 25/03057 |
| | | | | 375/233 |
| 6,487,246 | B1* | 11/2002 | Hoeld | H03K 7/08 |
| | | | | 375/238 |
| 2007/0230559 | A1* | 10/2007 | Kris | H03K 7/08 |
| | | | | 375/238 |
| 2013/0076417 | A1* | 3/2013 | Kris | H03K 7/08 |
| | | | | 327/160 |
| 2013/0082795 | A1* | 4/2013 | Kris | H03K 7/08 |
| | | | | 332/109 |
| 2014/0229755 | A1* | 8/2014 | Kris | H02J 1/102 |
| | | | | 713/340 |

* cited by examiner

*Primary Examiner* — Gary A Nash
(74) *Attorney, Agent, or Firm* — Mandy Barsilai Fernandez; Frank D. Cimino

(57) ABSTRACT

A pulse width modulation (PWM) system includes a PWM circuit and a controller. The PWM circuit includes a counter, a period register, and a duty cycle register. The controller is coupled to the PWM circuit. The controller is configured to calculate a period value and a duty cycle value. The controller is also configured to load the duty cycle value into the duty cycle register responsive to a count value of the counter being equal to a value of the duty cycle register and the duty cycle value being less than the period value.

24 Claims, 9 Drawing Sheets

PULSE WIDTH MODULATION CIRCUIT

BACKGROUND

Pulse-width-modulation (PWM) is a technique for controlling analog circuits with a digital signal, PWM is employed in a wide variety of applications, ranging from measurement and communications to power control and conversion. PWM digitally encodes analog signal levels in the duty cycle of a square wave, where the duty cycle is modulated to encode a specific analog signal.

In switched-mode power converters, PWM can be used to control a switching cycle of at least one switch of the power converter. A pulse-width-modulator may be used in an open-loop or closed-loop control arrangement to regulate the output of the power converter.

Digital controllers applied in switched-mode power converters may include digital PWM circuits, Use of digital controllers and digital PWM circuits can provide a number of advantages, including reduced sensitivity to parameter variations, programmability, and reduction or elimination of passive components.

SUMMARY

Examples of an improved pulse width modulation (PWM) system, and applications thereof are described herein. In one example, a PWM system includes a PWM circuit and a controller. The PWM circuit includes a counter, a period register, and a duty cycle register. The controller is coupled to the PWM circuit. The controller is configured to calculate a period value and a duty cycle value. The controller is also configured to load the duty cycle value into the duty cycle register responsive to a count value of the counter being equal to a value of the duty cycle register and the duty cycle value being less than the period value.

In another example, a method for PWM includes calculating, by a controller coupled to a PWM circuit, a period value and a duty cycle value for use in the PWM circuit. The method also includes determining, by the controller, that the duty cycle value is less than the period value, and determining, by the controller, that a count value of a counter of the PWM circuit is equal to a value of a duty cycle register of the PWM circuit. The method further includes loading, by the controller, the duty cycle value into the duty cycle register responsive to the count value being equal to the value of the duty cycle register and the duty cycle value being less than the period value.

In a further example, a non-transient computer-readable medium is encoded with instructions that when executed cause a processor to calculate a period value and a duty cycle value for use in a PWM circuit. The instructions also cause the processor to determine that the duty cycle value is less than the period value, and determine that a count value of a counter of the PWM circuit is equal to a value of a duty cycle register of the PWM circuit. The instructions further cause the processor to load the duty cycle value into the duty cycle register responsive to the count value being equal to the value of the duty cycle register and the duty cycle value being less than the period value.

In a yet further example, a power factor correction (PFC) circuit includes a half-bridge circuit and a PWM system. The half-bridge circuit includes a high-side transistor and a low-side transistor. The PWM system includes a PWM circuit and a controller. The PWM circuit includes a first output, a second output, a counter, a period register, and a duty cycle register. The first output is coupled to the high-side transistor. The second output is coupled the low-side transistor. The controller is coupled to the PWM circuit. The controller is configured to calculate a period value and a duty cycle value. The controller is also configured to load the duty cycle value into the duty cycle register responsive to a count value of the counter being equal to a value of the duty cycle register and the duty cycle value being less than the period value.

DETAILED DESCRIPTION

Figure 1:
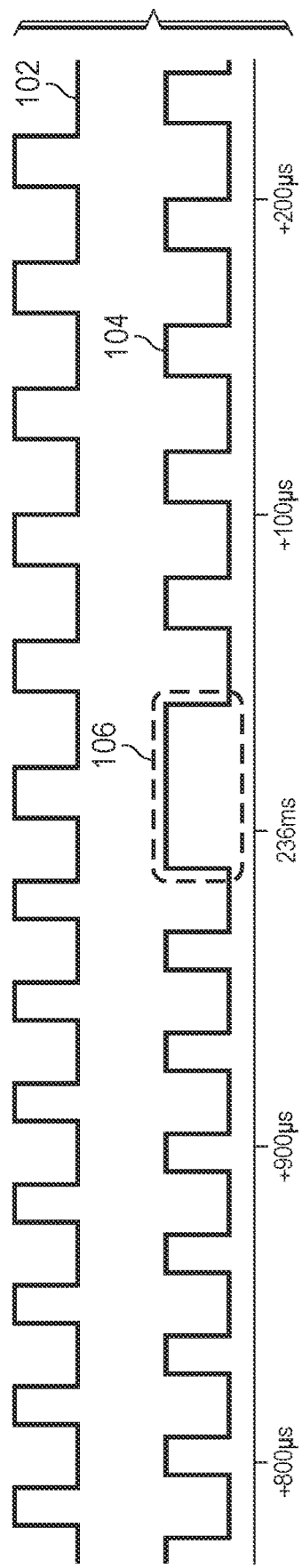
FIG. 1 is a graph of example pulse width modulation (PWM) signals, where one of the PWM signals has an abnormal duty cycle.

Some applications, power factor correction and multiphase DC-DC conversion for example, employ multiple pulse width modulation (PWM) circuits in concert. In such applications, multiple PWM circuits may be intended to generate PWM signals shifted in phase from one another, and having about the same duty cycle. However, it is relatively common for one of the PWM circuits to generate an abnormal PWM signal having a duty cycle of 100% or 0% in one or more consecutive cycles. Such aberrant operation can lead to control loop instability or abnormal output current and voltage, which may produce a current spike or overcurrent, and may damage a transistor controlled by the abnormal PWM signal. FIG. 1 is a graph of example PWM signals, where one of the PWM signals has an abnormal duty cycle. PWM signal 102 is generated by a first PWM circuit, and PWM signal 104 is generated by a second PWM circuit. In FIG. 1, as frequency and duty cycle of the 102 changes, the PWM signal 104 is generated with an abnormal duty cycle (100% duty cycle) in the interval 106.

Some PWM systems include additional circuitry to eliminate abnormal cycles. For example, PWM signals may be processed in a programmable logic device coupled to the output of the pulse width modulator. The programmable logic device modifies the PWM signals to correct abnormal PWM signals before the signals are applied to drive a transistor. Addition of the programmable logic device increases circuit area and cost. Other PWM systems reduce the occurrence of abnormal cycles by limiting the duty cycle of the PWM signals. Limiting PWM signal duty cycle may result in the PWM circuit being unable to generate the PWM signal with a suitable duty cycle, which may increase output voltage/current ripple.

The PWM system described herein eliminates abnormal duty cycle generation in applications that employ multiple PWM circuits. The PWM system includes control circuitry that identifies the operational conditions that may produce abnormal duty cycles in the PWM signals, and that controls updating of the PWM control registers so that abnormal duty cycles are avoided. No additional circuitry (e.g., no programmable logic devices) are needed, and the duty cycles of the PWM signals may range from 0% to 100%.

Figure 2:
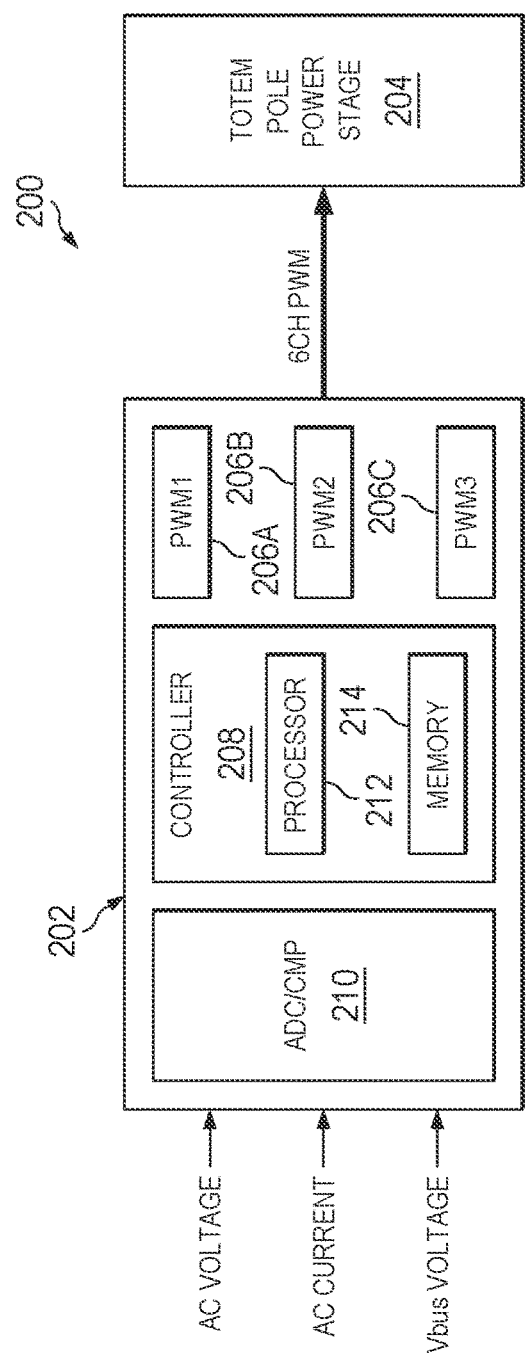
FIG. 2 is a block diagram of an example power factor correction (PFC) circuit implemented using a digital PWM system.

FIG. 2 is a block diagram of an example power factor correction (PFC) circuit 200 based on a digital PWM system. The PFC circuit 200 includes a PWM system 202 and a totem-pole power stage 204. The PWM system 202 is coupled to the totem-pole power stage 204. The PWM system 202 includes PWM circuit 206A, 206B, and 206C, a controller 208, and an analog-to-digital converter/comparator circuit 210 (ADC/CMP 210). Some examples of the PWM system 202 may include a different number of PWM circuits. The controller 208 may include a processor 212, which may be a general-purpose microprocessor core, a digital-signal processor core, etc., and memory 214 storing instructions that are executed by the processor to control the PWM circuits 206A, 206B, and 206C as described herein. The memory 214 may include volatile semiconductor memory, non-volatile semiconductor memory, and/or other data/instruction storage devices (non-transient computer-readable media). The ADC/CMP 210 includes an analog-to-digital converter (ADC) for digitizing voltage and current signals in the PFC circuit 200, and a comparator for comparing signals in the PFC circuit 200 to a threshold.

The PWM circuits 206A, 206B, and 206C includes circuitry for generating PWM signals to control the totem-pole power stage 204. Each of the PWM circuits 206A, 206B, and 206C may include a counter, registers, comparators, and other circuitry for generating the PWM signals. The totem-pole power stage 204 includes multiple transistor pairs. Each transistor pair is controlled by one of the PWM circuits 206A, 206B, and 206C.

Figure 3A:
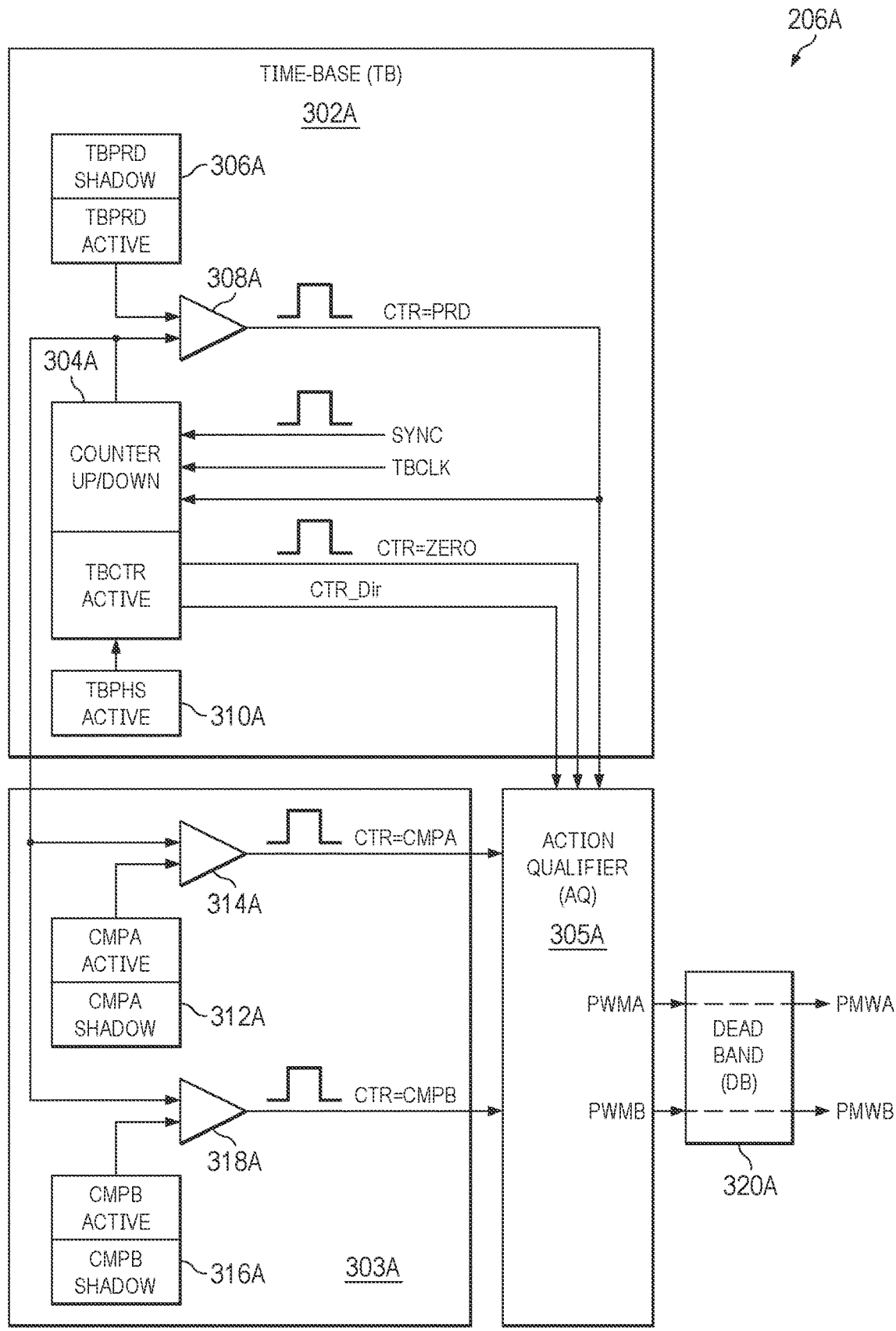
FIGS. 3A and 3B are block diagrams of an example PWM circuit.
Figure 3B:
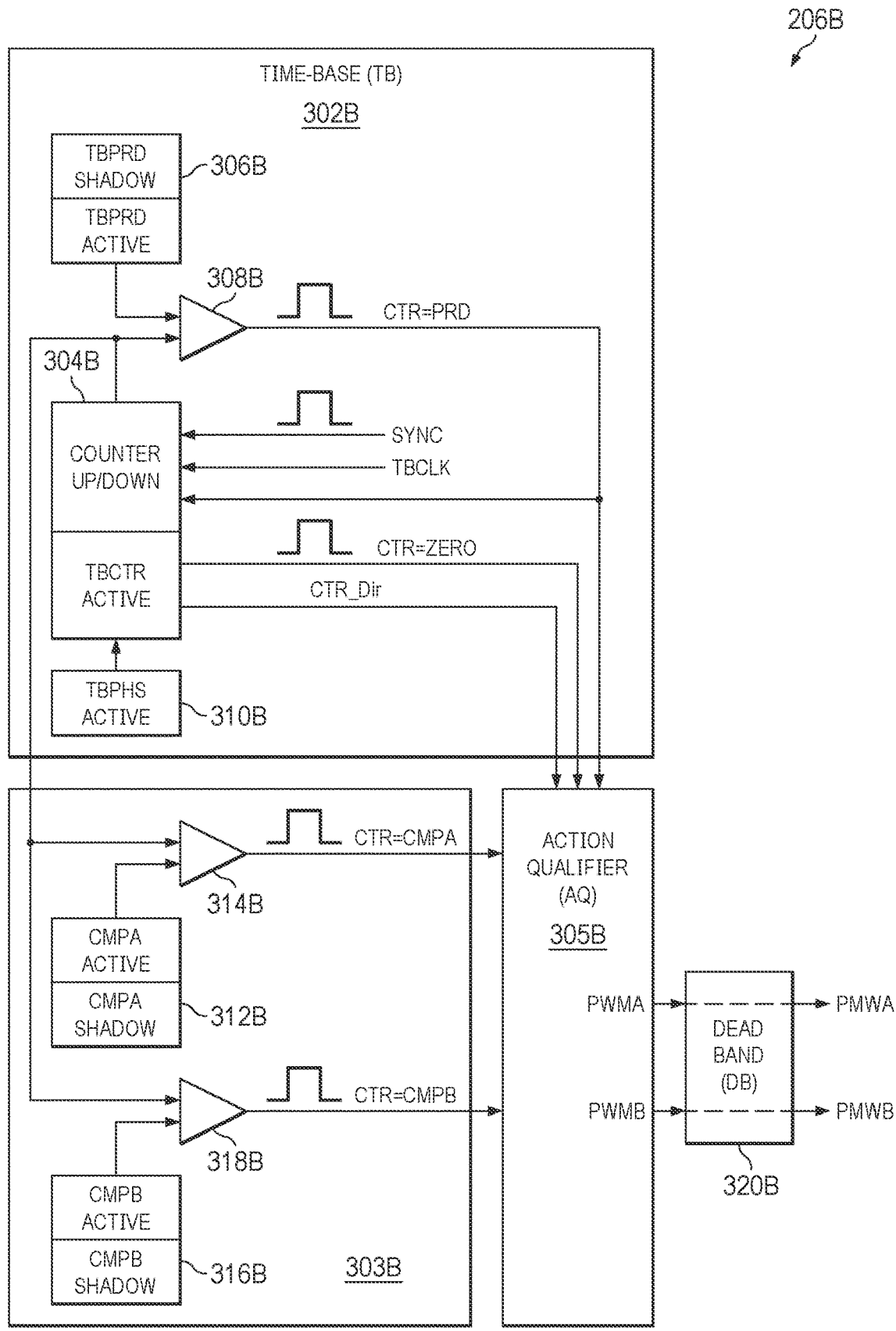

FIGS. 3A and 3B are block diagrams of example PWM circuits 206A and 206B as shown in FIG. 2. The PWM circuits 206A, 206B, and 206C are identical. FIGS. 3A and 3B differ only in the reference characters provided. The duplicative figures are provided to facilitate explanation of interaction between two PWM circuits, where PWM circuits 206A and 206B are used as examples. Description of any one of the PWM circuits 206A, 206B, and 206C is applicable to the other two of the PWM circuits 206A, 206B, and 206C. Additional description of the components of the PWM circuits 206A, 206B, and 206C and operation thereof is provided in, for example, TMS320x2806c Piccolo Technical Reference Manual, pp. 240-369 (2013), published by Texas Instruments Inc.

The PWM circuit 206A (FIG. 3A) includes a time base circuit 302A, a comparator circuit 303A, an action qualifier circuit 305A, and a dead band circuit 320A. The time base circuit 302A includes a counter 304A, a period register 306A, a comparator 308A, and a phase register 310A. The comparator circuit 303A includes a comparator 314A, a compare register 312A, a comparator 318A, and a compare register 316A. Similarly, the PWM circuit 206B (FIG. 3B) includes a time base circuit 302B, a comparator circuit 303B, an action qualifier circuit 305B, and a dead band circuit 320B. The time base circuit 302B includes a counter 304B, a period register 306B, a comparator 308B, and a phase register 310B. The comparator circuit 303B includes a comparator 314B, a compare register 312B, a comparator 318B, and a compare register 316B.

The counter 304A is incremented (or decremented) by a time base clock (TBCLK). The PWM circuit 206A may divide a system clock by a selected (user selected) divisor to produce the time base clock. The comparator 308A compares the output of the counter 304A to a period value stored in the period register 306A (TBPRD-time base period register). The period register 306A includes an active register and a shadow register. The output of the active register is coupled to an input of the comparator 308A. The output of the shadow register is coupled to the input of the active register. The shadow register provides double-buffering that allows synchronization of an output of the active register to an event (a value previously stored in shadow register is transferred to the active register responsive to an event (e.g., the counter 304A equals zero). The compare registers 312A and 316A also include active and shadow registers that operate as described with regard to the period register 306A.

The period value stored in the period register 306A determines the period of the PWM signals. The output of the comparator 308A is coupled to an input of the counter 304A, and an output signal of the comparator 308A, which indicates that the output of the counter 304A is equal to the period value stored in the period register 306A, may reset the counter 304A to zero. The phase register 310A stores a phase value that may be loaded into a register (TBCTR) coupled to the counter 304A responsive to a synchronization signal (SYNC) received from another PWM circuit 206B or 206C, to allow for synchronization of the counter 304A across multiple PWM circuits. In some implementations, the ratio of the value stored in the phase register 310B to the value stored in the period register 306B determines the phase shift between the PWM circuit 206A and the PWM circuit 206B. In one example, when the value in the phase register 3108 of the PWM circuit 206B is set to half of the value in the period register 306B of the PWM circuit 206B and the PWM circuit 206A, the phase shift between the PWM circuit 206A and the PWM circuit 206B is set to 180°. The value of the counter 304B is set to the value in the phase register 3108 of the PWM circuit 206B, in response to the SYNC signal indicating that the value of the counter 304A of the PWM circuit 206A is zero.

The comparator circuit 303A is coupled to the time base circuit 302A, and includes a comparator 314A, a compare register 312A, a comparator 318A, and a compare register 316A. The comparator 314A compares a value stored in the compare register 312A to the output of the counter 304A. The comparator 318A compares a value stored in the compare register 316A to the output of the counter 304A. The compare register 312A may be applied to set the duty cycle of the PWM signals. For example, to set a duty cycle of the PWM signals to 50%, the value in the compare register 312A is set to half of the value in period register 306A. The ratio of the value stored in the compare register 312A to the value stored in the period register 306A determines the duty cycle of the PWM signals in some examples. The compare register 316A and the comparator 318A may also be used to set the duty cycle of the PWM signals.

The values stored in the various registers of the PWM circuit 206A, including the period register 306A, the phase register 310A, the compare register 312A, and the compare register 316A may be computed by and/or provided to the PWM circuit 206A by the controller 208.

The action qualifier circuit 305A is coupled to the time base circuit 302A and the comparator circuit 303A. The action qualifier circuit 305A generates the PWM signals based on the outputs of the time base circuit 302A and the comparator circuit 303A (e.g., based on the outputs of the comparator 308A, the comparator 314A, and the comparator 318A, and the value of the counter 304A). The action qualifier circuit 305A may be configured to set, reset, toggle, or do nothing to a PWM signal responsive to the outputs of the time base circuit 302A and comparator circuit 303A. For example, the action qualifier circuit 305A may set a PWM signal responsive to the value of the counter 304A being zero, and reset the PWM signal responsive to the output of the comparator 314A (the value of the counter 304A being equal to the value stored in the compare register 312A). In this example, the duty cycle of the PWM signal may be established by the output of the comparator 314A or the output of the comparator 318A. The action qualifier circuit 305A may output a pair of PWM signals, PWMA and PWMB.

Figure 4:
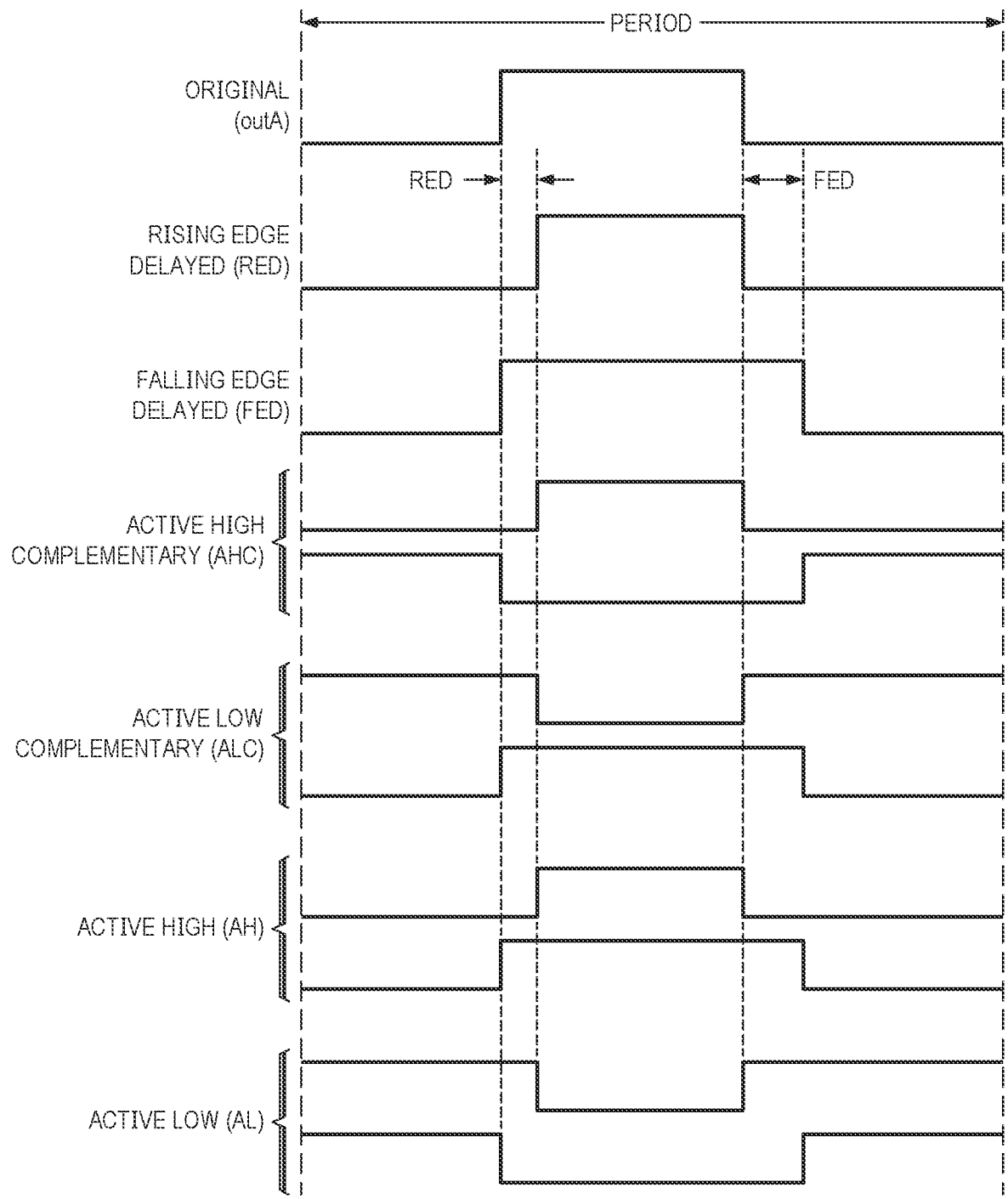
FIG. 4 shows example dead band delays applied to PWM signals in the PWM circuit of FIG. 3.

Some implementations of the PWM circuit 206A include a dead band circuit 320A coupled to the action qualifier circuit 305A. The dead band circuit 320A adds dead time delay to the edges of the PWM signals received from the action qualifier circuit 305A. The dead band circuit 320A may also invert a selected input signal (PWMA or PWMB) to generate a complementary output. In some examples, the dead band circuit 320A can support active high complementary output, active low complementary output, active high output, and active low output, shown as in FIG. 4.

Figure 5:
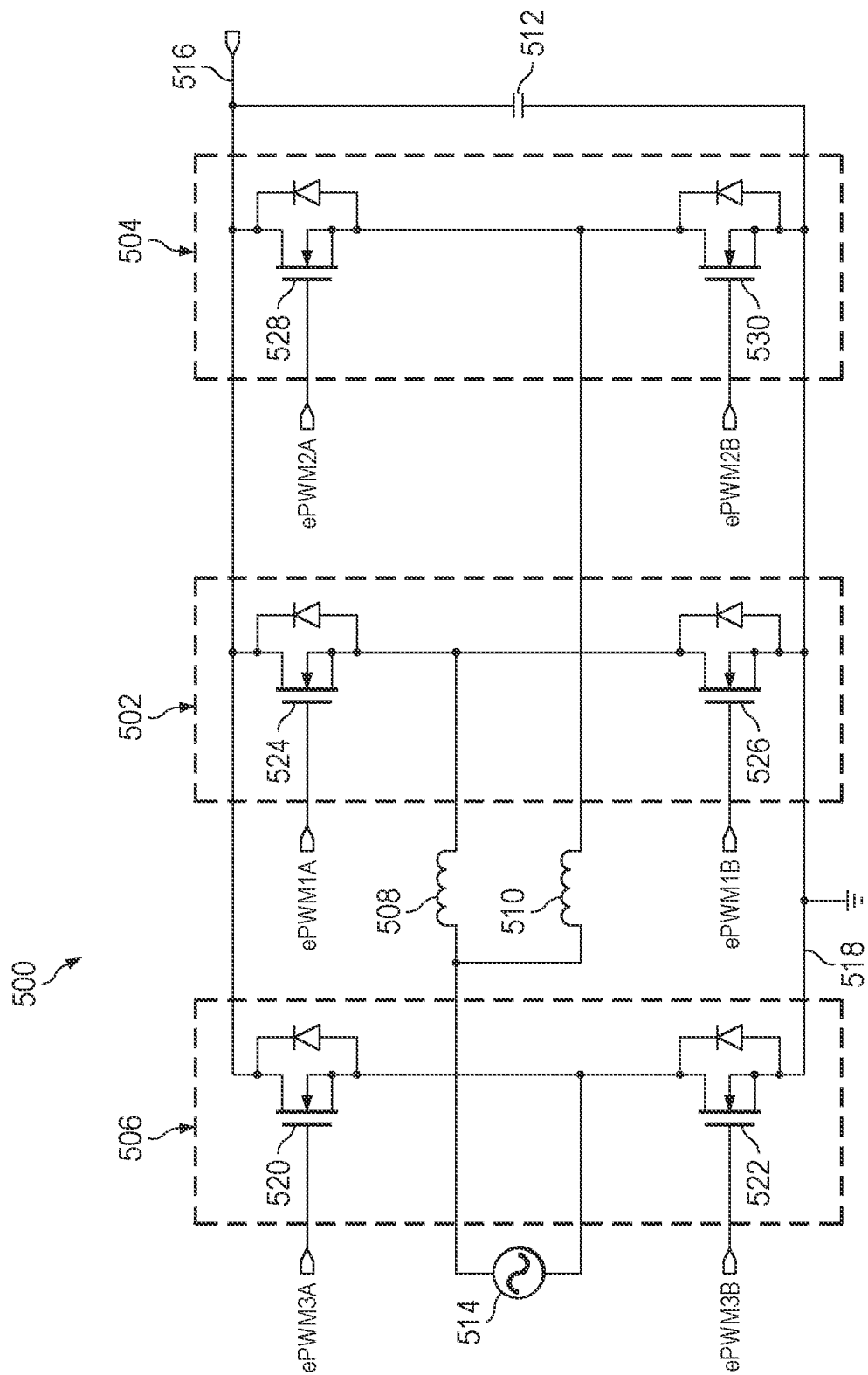
FIG. 5 is a schematic level diagram of an example power stage of an interleaved totem pole PFC circuit.

FIG. 5 is a schematic level diagram of an example power stage 500 of an interleaved totem pole PFC circuit (e.g., totem-pole power stage 204 of FIG. 2). The power stage 500 includes a half-bridge circuit 502, a half-bridge circuit 504, a half-bridge circuit 506, and inductor 508, an inductor 510, and an output capacitor 512. The inductor 508 is coupled between the half-bridge circuit 502 and a first output of an AC voltage source 514. The inductor 510 is coupled between the half-bridge circuit 504 and the first output of the AC voltage source 514. Each of the half-bridge circuits 502, 504, and 506 includes a high-side transistor (high-side transistors 520, 524, and 528) and a low-side transistor (low-side transistors 522, 526, and 530). The high-side transistors and the low-side transistors may be n-channel field effect transistors in some implementations of the power stage 500. A drain of the high-side transistor is coupled to a DC output 516 of the power stage 500. A source of the high-side transistor is coupled to the drain of the low-side transistor. A source of the low-side transistor is coupled to a ground terminal 518. The output capacitor 512 is coupled between the DC output 516 and the ground terminal 518.

The half-bridge circuit 502 is controlled by the PWM circuit 206A. The half-bridge circuit 504 is controlled by the PWM circuit 206B. The half-bridge circuit 506 is controlled by the PWM circuit 206C. The complementary PWM signals PWMA and PWMB generated by the PWM circuits 206A, 206B, and 206C are respectively coupled to the gates of the high-side transistor and the low-side transistor to control the switching thereof. In FIG. 5, outputs of the PWM circuits 206A, 206B, and 206C are labeled PWM1A/PWM1B, PWM2A/PWM2B, and PWM3A/PWM3B, respectively.

While the power stage 500 is configured to convert an AC input signal to a DC output signal, in an alternate example, the power stage 500 can be configured to convert a DC input signal to an AC output signal. In inverter mode operation (DC-AC conversion), a DC power source is coupled to the DC output 516 (which serves as input in the inverter mode), and the power stage 500 provides an AC voltage across a load that replaces the AC voltage source 514. In PFC operation, the PWM signals are configured to correct the power factor of the power stage 500 to adjust the output signal. In the power stage 500, power factors are corrected by adjusting the duty cycle or the frequency of the PWM signals provided by the PWM circuits 206A, 206B and 206C. The duty cycle of the PWM signals may range from 0% to 100%.

In some implementations of the PFC circuit 200, the compare register 312B is used to realize PWM duty cycle control, and the phase register 310B is used to realize phase shift control between the PWM circuits 206A and 206B. A threshold is set in the compare register 312A of the PWM circuit 206A, and the PWMA signal switches from logic high to logic low in response to the output of the comparator 314A when the output of the counter 304A reaches the threshold set in the compare register 312A. A value in the phase register 310B of the PWM circuit 206B defines the phase shift between PWM circuit 206A and PWM circuit 206B. The counter 304A is configured to count up based on TBCLK, and periodically reset to zero in response to the counter value reaching a value stored in the period register 306A. However, since PWM duty cycle and phase shift are not updated at the same time, an event defined by the output of the comparator 314A may not occur in the PWM circuit 206B, which causes an abnormal (e.g., 100%) duty cycle output in one PWM cycle.

Figure 6:
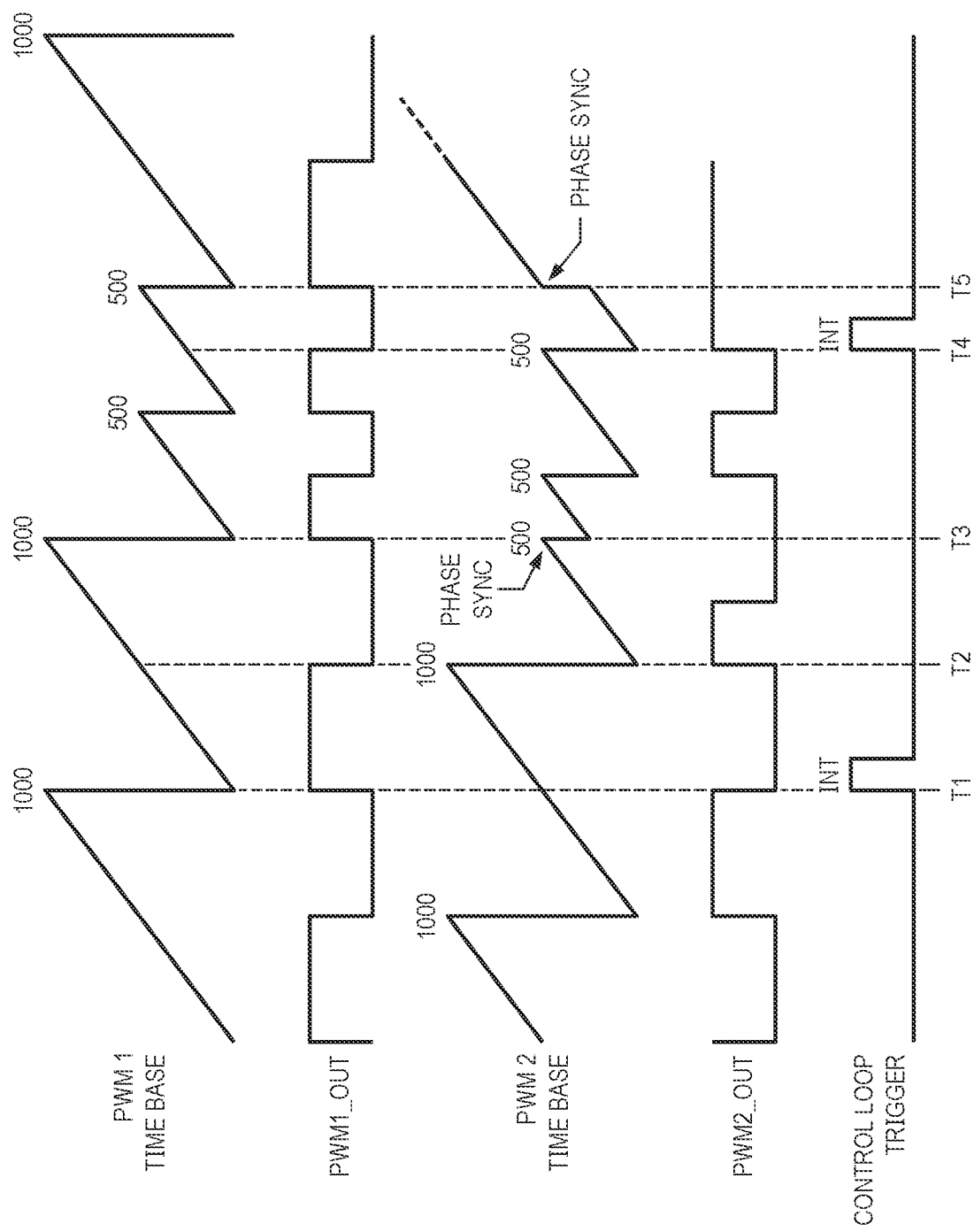
FIG. 6 is a timing diagram of signals in a PWM system illustrating generation of an improper duty cycle.

FIG. 6 is a timing diagram of signals in an example PWM system illustrating generation of an abnormal PWM cycle. In FIG. 6, the signal PWM1 time base represents a count value generated in the counter 304A of the PWM circuit 206A. The signal PWM1_OUT represents the PWM signal (PWMA or PWMB) output by the PWM circuit 206A. The signal PWM2 time base represents a count value generated in the counter 304B of the PWM circuit 206B. The signal PWM2_OUT represents the PWM signal (PWMA or PWMB) output by the PWM circuit 206B. The signal Control loop trigger represents the time during which the controller 208 computes new register values for application in the PWM circuit 206A and the PWM circuit 206B.

At time T1, the controller 208 computes new values for the period register 306B, the phase register 310B, and the compare register 312B of the PWM circuit 206B based on the periodic signal Control loop trigger. The calculation is complete when the Control loop trigger signal is reset to a logic low. The controller 208 updates the phase register 310B when the new value is available.

At time T2, when the value of the counter 304B of the PWM circuit 206B is reset to zero, the period register 306B and the compare register 312B are updated with the calculated new values.

At time T3, the phase shift between the PWM circuit 206A and the PWM circuit 206B is synchronized based on the value in the phase register 310B by setting the value of the counter 304B of the PWM circuit 206B based on the updated value in the phase register 310B.

At time T4, the controller 208 computes new values for the period register 306B, the phase register 310B, and the compare register 312B of the PWM circuit 206B. The calculation is complete when the Control loop trigger signal is reset to a logic low. After the calculation, the phase register 310B of the PWM circuit 206B is immediately updated, but the period register 306B and the compare register 312B are not immediately updated.

At time T5, the value of the counter 304B of the PWM circuit 206B is set to 500 according to the updated value of the phase register 310B of the PWM circuit 206B. The values of the period register 306B and the compare register 312B are not updated and the value of the counter 304B of the PWM circuit 206B is changed from 250 to 500. Therefore, if the compare register 312B of the PWM circuit 206B is set between 250 and 500, there will be no event generated by the comparator 314B of the PWM circuit 206B with the increasing of the value of the counter 304B of the PWM circuit 206B. PWM2_OUT remains logic high producing a 100% duty cycle.

To ¶eliminate abnormal duty cycles, the controller 208 configures the PWM system 202 to generate the PWM signals using a control sequence different from that explained with regard to FIG. 6. In embodiments of the PWM system 202 that avoid abnormal duty cycles, the PWM circuit 206A provides PWM duty cycle control through its compare register 312A, while the PWM circuit 206B provides 180° phase-shifting control using the comparator 314B, and duty cycle control through the compare register 316B. Alternatively, the PWM circuit 206B may provide 180° phase-shifting control using the compare register 3168, and duty cycle control through the comparator 314B. The second PWM circuit 206B generates PWM signals based on the values of the counter 304B, the period register 306B, the compare register 312B, and the compare register 316B. The period register 306B of the PWM circuit 206B is set to the same value as the period register 306A of the PWM circuit 206A. The compare register 3128 of the PWM circuit 206B is set to half of the value in the period register 306A of the PWM circuit 206A when the phase shift between the PWM signals generated by the PWM circuit 206A and the PWM signals generated by the PWM circuit 206B is to be 180°. The controller 208 calculates the value of the compare register 3168 of the PWM circuit 206B based on a sum of the value of the compare register 3128 of the PWM circuit 206B and a target duty cycle of the PWM circuit 206B. For example, if the PWM circuits 206A and 206B are to output 10% duty cycle, and the value stored in the period register 306A is 500, then, the controller 208 stores the value 50 in the compare register 312A of the PWM circuit 206A, and for the PWM circuit 206B, the controller 208 stores the value 250 in the compare register 312B of the PWM circuit 206B and the value 300 (250+50) in the compare register 316B of the PWM circuit 206B.

The PWM system 202, via the controller 208, updates duty cycle, period, and phase shift of the PWM circuit 206A and the PWM circuit 206B in a same PWM cycle, and loads the duty cycle value of the PWM circuit 206B twice in one PWM cycle to overcome the loss of an event produced by the comparator 318B when the duty cycle is near 50%.

The controller 208 uses two interrupts to control the PWM circuit 206A and the PWM circuit 206B. The first interrupt is generated by the PWM circuit 206A in response to the value of the counter 304A of the PWM circuit 206A being reset to zero. The second interrupt is generated by the PWM circuit 206B in response to the value of the counter 304B being equal to the value stored in the compare register 316B. The controller 208 enables the second interrupt with the high priority, and only when needed.

The first interrupt is generated by the PWM circuit 206A in response to the value of the counter 304A being zero to update the values stored in the period and compare registers of the PWM circuits 206A and 206B. The register value provided by the controller 208 include a new value (R_TBPRD) for the period register 306A of the PWM circuit 206A and the PWM circuit 206B, a new value (R_CPMA1) for the compare register 312A of the PWM circuit 206A, a new value (R_CMPA2) for the compare register 312B of the PWM circuit 206B, and a new value (R_CMPB) for the compare register 316B of the PWM circuit 206B. The controller 208 calculates the new values based on a target PWM duty cycle (R_CMPA/R_TBPRD) and a target PWM period (R_TBPRD). The new values R_CMPA1 and R_TBPRD1 are calculated respectively for the compare register 312A and the period register 306A of the PWM circuit 206A. The new values T_CMPA2, R_CMPB and R_TBPRD2 are calculated respectively for the compare register 312B, the compare register 316B, and the period register 306B of the PWM circuit 206B. R_TBPRD1 and R_TBPRD2 are same (both are equal to R_TBPRD).

After calculation of the new register values, in response to the controller 208 detecting a last calculated R_CMPB that is greater than or equal to a last calculated R_TBPRD, and a presently calculated R_CMPB (which is to be loaded to the compare register 316B of the PWM circuit 206B) that is less than a presently calculated R_TBPRD, the controller 208 does not store the calculated new R_CMPB value in the compare register 316B of the PWM circuit 206B, but the controller 208 enables the second interrupt. The PWM circuit 206B generates the second interrupt based on the value of the counter 304B of the PWM circuit 206B being equal to the value stored in the compare register 316B of the PWM circuit 206B. In servicing the second interrupt, the controller 208 configures the compare register 316B to operate in an immediate mode, and stores the R_CMPB value in the compare register 316B using the immediate mode of the compare register 316B. After the controller 208 stores the R_CMPB value in the compare register 316B using the immediate mode, the controller 208 disables the immediate mode of the compare register 316B, configures the compare register 316B to operate in the shadow mode of the compare register 316B, and disables the second interrupt. In immediate mode, the compare register 316B propagates the value stored in the compare register 316B to the output of the compare register 316B with no delay (immediately). In shadow mode, the compare register 316B operates as a double-buffer, and transfers the value stored in the compare register 316B to the output of the compare register 316B responsive to an event (e.g., the value of the counter 304B being equal to zero or equal to the value of the period register 306B).

Figure 7:
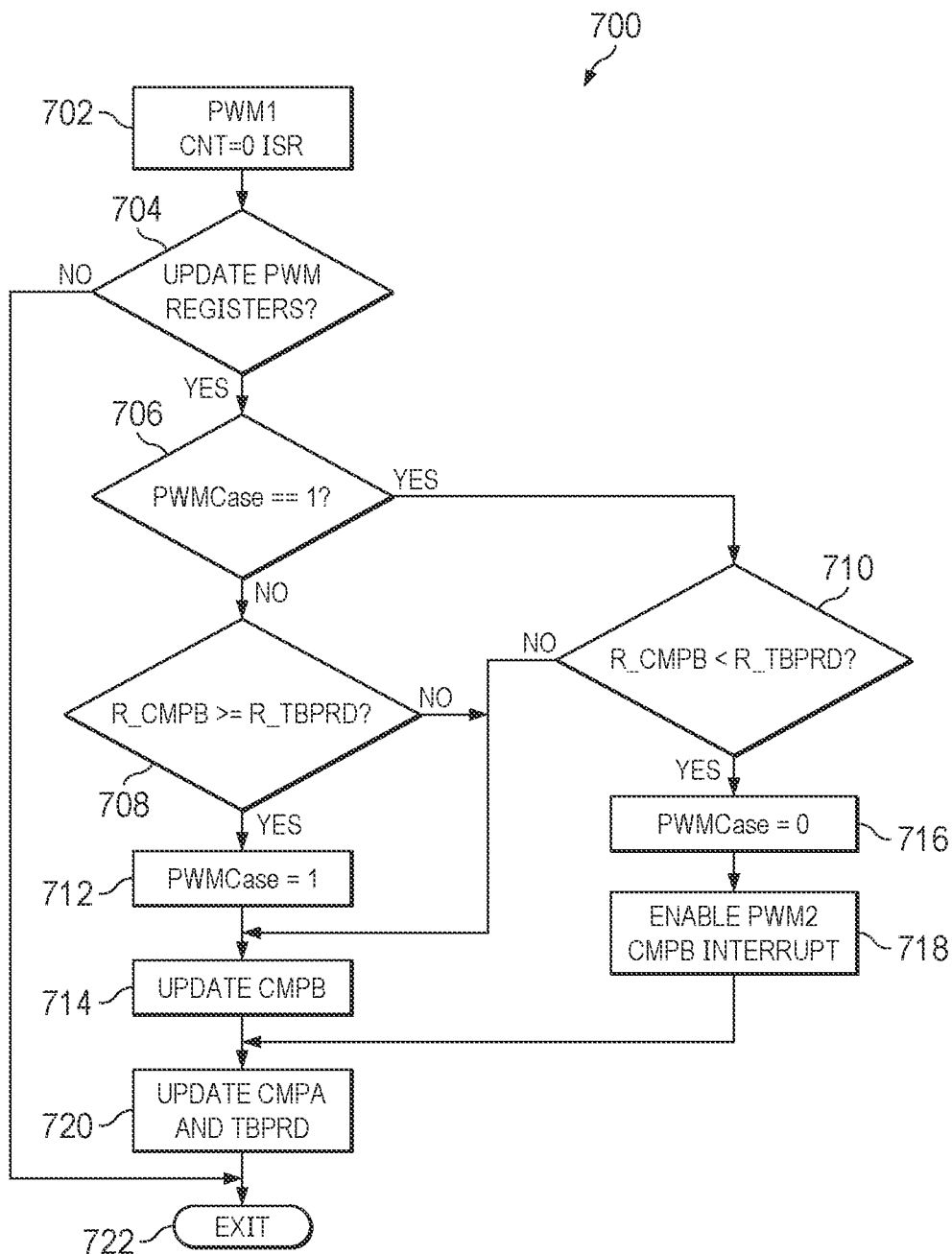
FIGS. 7 and 8 are flow diagrams for an example method for controlling PWM circuits that avoids abnormal duty cycles.
Figure 8:
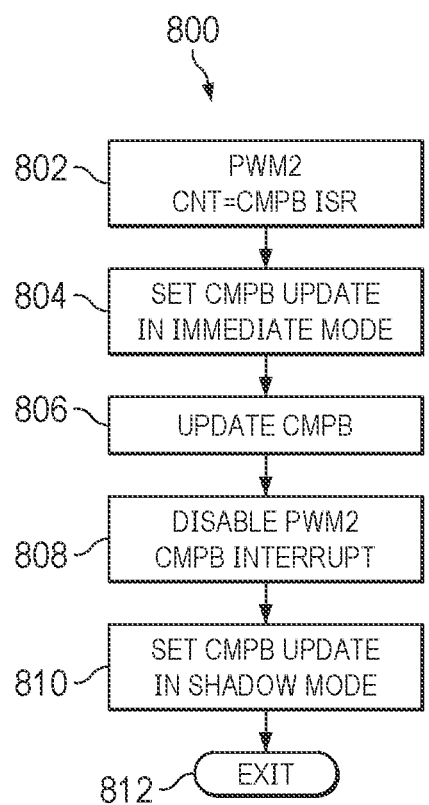

FIGS. 7 and 8 are flow diagrams for an example method for controlling PWM circuits 206A and 206B that avoids abnormal duty cycles. FIG. 7 is a flow diagram of an example method 700 for servicing the first interrupt as part of controlling the PWM circuits 206A and 206B, and FIG. 8 is a flow diagram of an example method 800 for servicing the second interrupt as part of controlling the PWM circuits 206A and 206B. The operations of the methods 700 and 800 may be performed by the controller 208. For example, the processor 212 may execute instructions stored in the memory 214 to perform the operations of the methods 700 and 800. Though depicted sequentially as a matter of convenience, at least some of the operations shown can be performed in a different order and/or performed in parallel. Additionally, some implementations may perform only some of the operations shown.

In block 702, the value of the counter 304A of the PWM circuit 206A is equal to zero. In response to the value of the counter 304A being equal to the value stored in the period register 306A, the PWM circuit 206A resets the counter 304A to zero, and the PWM circuit 206A generates the first interrupt for service by the controller 208.

In block 704, the controller 208 determines whether new register values have been computed, by the controller 208, for use in the PWM circuits 206A and 206B. That is, the controller 208 determines whether a new period value (R_TBPRD), a new phase value (R_CMPA2), and/or a new duty cycle value (R_CMPB, R_CMPA1) have been computed, by the controller 208, for use in the PWM circuit 206A and the PWM circuit 206B. If new values have not been computed, then the method continues in block 722 (exit the first interrupt service routine).

If new values have been computed, then, in block 706, the controller 208 determines whether a flag (PWMCase) is set. PWMCase is set (by the controller 208 in block 712 in service of a previous interrupt) if, in the last executed register update (the last execution of the interrupt service routine 1 in which registers were updated), the new duty cycle value (R_CMPB) was greater than or equal to the new period value (R_TBPRD). PWMCase indicates that the current value of the compare register 316B is greater than or equal to the current value of the period register 306B.

If PWMCase is set, then, in block 710, the controller 208 determines whether the new duty cycle value is less than the new phase value. If the new duty cycle value is less than the new phase value, then the controller 208 resets PWMCase to zero in block 716, and enables generation of the second interrupt by the PWM circuit 206B in block 718.

If, in block 710, the new duty cycle value is not less than the new period value, then, in block 714, the controller 208 loads the new duty cycle value into the compare register 316B (CM PB).

Returning to block 706, if PWMCase is not set, then, in block 708, the controller 208 determines whether the new duty cycle value is greater than or equal to the new period value. If the new duty cycle value is greater than or equal to the new period value, then the controller 208 sets PWMCase to one in block 712, and loads the new duty cycle value into the compare register 316B in block 714. If the new duty cycle value is less than the new period value, then the controller 208 loads the new duty cycle value into the compare register 316B in block 714 without setting PWMCase.

In block 720, the controller 208 loads the phase value R_CMPA2 into the compare register 312B, loads the new duty cycle value R_CMPA1 into the compare register 312A (CMPA refers to the compare registers 312A and 312B in block 720), and loads the new period value R_TBPRD into the period registers 306A and 306B (TBPRD refers to the period registers 306A and 306B in block 720).

In block 722, the controller 208 exits the first interrupt service routine.

In block 802, the value of the counter 304B of the PWM circuit 206B is equal to the value stored in the compare register 316B (CMPB) of the PWM circuit 206B (the current duty cycle value). The controller 208 enabled generation of the second interrupt in block 718 of the method 700. With the second interrupt enabled, in response to the value of the counter 304B being equal to the value stored in the compare register 316B, the PWM circuit 206B generates the second interrupt for service by the controller 208.

In block 804, the controller 208 configures the compare register 316B of the PWM circuit 206B to operate in immediate mode.

In block 806, the controller 208 stores the new duty cycle value in the compare register 316B of the PWM circuit 206B.

In block 808, the controller 208 disables generation of the second interrupt by the PWM circuit 206B.

In block 810, the controller 208 configures the compare register 316B of the PWM circuit 206B to operate in shadow mode.

In block 812, the controller 208 exits the second interrupt service routine.

Figure 9:
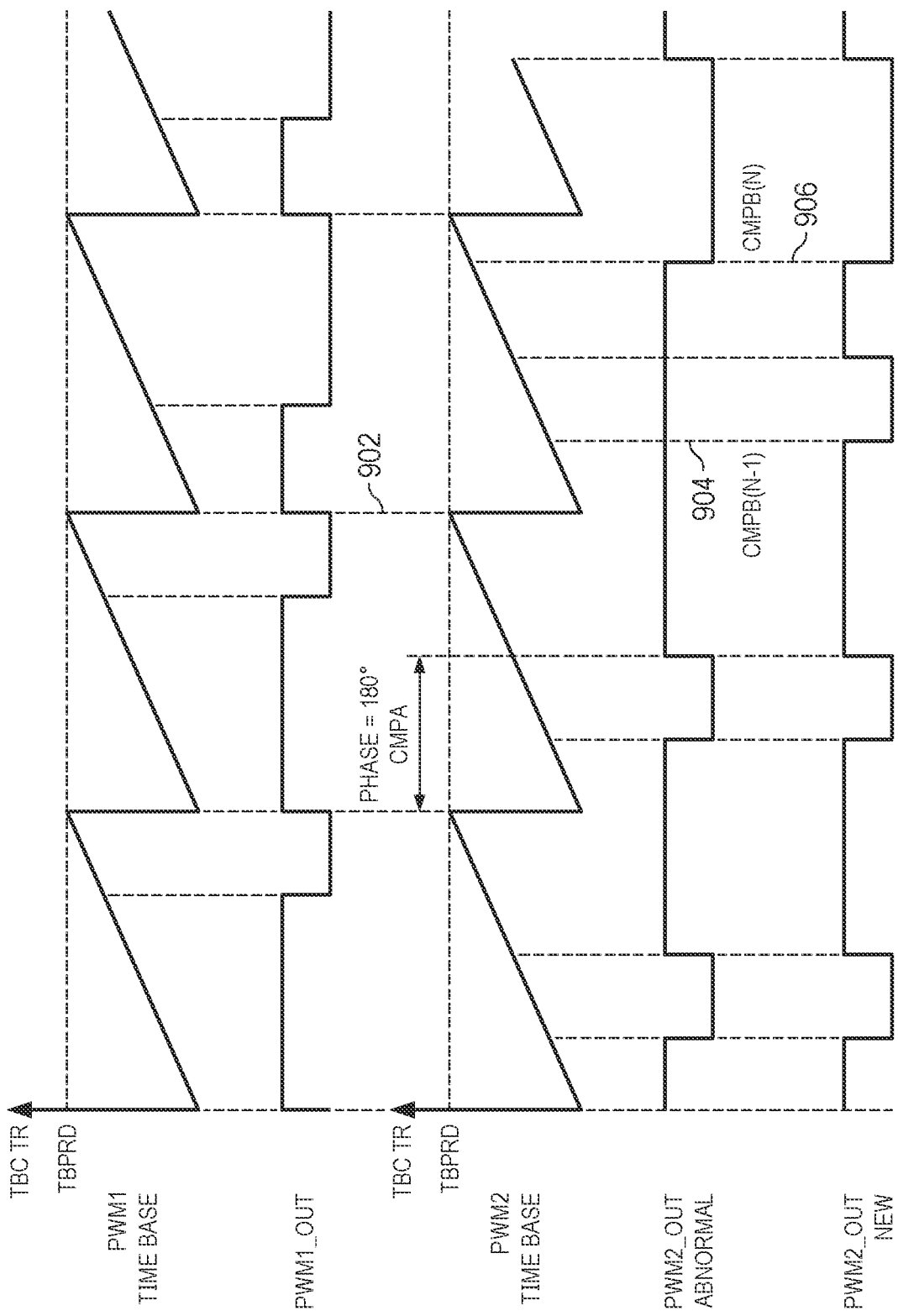
FIG. 9 is a timing diagram comparing example PWM signals generated by a PWM system with and without operation in accordance with the method of FIGS. 7 and 8.

FIG. 9 is a timing diagram comparing example PWM signals generated by a PWM system with and without operation in accordance with the methods 700 and 800. In FIG. 9, the signal PWM1 time base represents a count value generated in the counter 304A of a PWM circuit 206A. The signal PWM1_OUT represents the PWM signal (PWMA) output by the PWM circuit 206A. The signal PWM2 time base represents a count value generated in the counter 304B of a PWM circuit 206B. The signal PWM2_OUT ABNORMAL represents the PWM signal (PWMA) output by the PWM circuit 206B when not applying the methods 700 and 800. The signal PWM2_OUT NEW represents the PWM signal (PWMA) output by the PWM circuit 206B when applying the methods 700 and 800. The duty cycle of the signal PWM1_OUT is set by the zero state of the counter 304A and the output of the comparator 314A. The duty cycle of the signals PWM2_OUT ABNORMAL and PWM2_OUT NEW are set by the output of the comparator 314B and the comparator 318B. The signals PWM2_OUT ABNORMAL and PWM2_OUT NEW are shifted in phase by 180° relative to the signal PWM1_OUT based on the value stored in the compare register 312B (CMPA).

When the duty cycle of the signal PWM1_OUT changes at time 902, the duty cycle of the signal PWM2_OUT ABNORMAL is also changed and the duty cycle of PWM2_OUT ABNORMAL is 100% for one PWM cycle. In contrast, operation of the methods 700 and 800 does not change the duty cycle of the signal PWM2_OUT NEW until time 904 and no abnormal duty cycle is produced. The falling edge of PWM1_OUT at time 904 is produced by the output of the comparator 314B using a same duty cycle value (CMPB(N−1)) as in the prior PWM cycle. At time 906, the falling edge of PWM2_OUT is produced using the duty cycle value (CMPB(N)) applied in the PWM circuit 206A at time 902. The methods 700 and 800 ensure that duty cycle, period, and phase shift, in the PWM circuit 206B, are updated in a same PWM cycle, and can update the compare register 316B twice in one PWM cycle.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A pulse width modulation (PWM) system, comprising:
   a PWM circuit including:
      a counter;
      a period register; and
      a duty cycle register; and
   a controller coupled to the PWM circuit, the controller configured to:
      calculate a period value and a duty cycle value; and
      load the duty cycle value into the duty cycle register responsive to a count value of the counter being equal to a value of the duty cycle register, and the duty cycle value being less than the period value.

2. The PWM system of claim 1, wherein the controller is configured to:
   responsive to the duty cycle value being less than the period value, enable generation of an interrupt triggered by the count value of the counter being equal to the value of the duty cycle register; and
   load the duty cycle value into the duty cycle register responsive to the interrupt.

3. The PWM system of claim 2, wherein the controller is configured to enable generation of the interrupt responsive to a current value of the duty cycle register being greater than or equal to a current value of the period register.

4. The PWM system of claim 2, wherein the controller is configured to disable the interrupt responsive to loading duty cycle value into the duty cycle register.

5. The PWM system of claim 2, wherein the controller is configured to:
   load the duty cycle value into the duty cycle register using an immediate mode; and
   after loading the duty cycle value into the duty cycle register, set the duty cycle register to operate in a shadow mode.

6. The PWM system of claim 1, wherein the controller is configured to:
   responsive to the duty cycle value being greater than or equal to the period value, load the duty cycle value into the duty cycle register.

7. The PWM system of claim 1, wherein:
   the PWM circuit is a first PWM circuit; and
   the PWM system includes a second PWM circuit having:
      a counter; and
   the controller is configured to load the duty cycle value into the duty cycle register responsive to the value of the counter of the second PWM circuit being equal to zero.

8. A method for pulse width modulation (PWM), comprising:
   by a controller coupled to a PWM circuit:
      calculating a period value and a duty cycle value for use in the PWM circuit;
      determining that the duty cycle value is less than the period value;
      determining that a count value of a counter of the PWM circuit is equal to a value of a duty cycle register of the PWM circuit; and
      loading the duty cycle value into the duty cycle register responsive to the count value being equal to the value of the duty cycle register, and the duty cycle value being less than the period value.

9. The method of claim 8 further comprising:
responsive to the duty cycle value being less than the period value, enabling, by the controller, generation of an interrupt triggered by the count value being equal to the value of the duty cycle register; and
loading, by the controller, the duty cycle value into the duty cycle register responsive to the interrupt.

10. The method of claim 9 further comprising:
enabling, by the controller, generation of the interrupt responsive to a current value of the duty cycle register being greater than or equal to a current value of a period register; and
disabling, by the controller, generation of the interrupt responsive to loading the duty cycle register.

11. The method of claim 9 further comprising:
loading, by the controller, the duty cycle value into the duty cycle register using an immediate mode; and
after loading the duty cycle value into the duty cycle register, setting, by the controller, the duty cycle register to operate in a shadow mode.

12. The method of claim 8 further comprising:
responsive to the duty cycle value being greater than or equal to the period value, loading, by the controller, the duty cycle value into the duty cycle register.

13. The method of claim 8 wherein:
the PWM circuit is a first PWM circuit; and
the method includes:
loading, by the controller, the duty cycle value into the duty cycle register responsive to the value of a counter of a second PWM circuit being zero.

14. A non-transient computer-readable medium encoded with instructions that when executed cause a processor to:
calculate a period value and a duty cycle value for use in a pulse width modulation (PWM) circuit;
determine that the duty cycle value is less than the period value;
determine that a count value of a counter of the PWM circuit is equal to a value of a duty cycle register of the PWM circuit; and
load the duty cycle value into the duty cycle register responsive to the count value being equal to the value of the duty cycle register, and the duty cycle value being less than the period value.

15. The non-transient computer-readable medium of claim 14, wherein the instructions, when executed, cause the processor to:
responsive to the duty cycle value being less than the period value, enable generation of an interrupt triggered by the count value being equal to the value of the duty cycle register; and
load the duty cycle value into the duty cycle register responsive to the interrupt.

16. The non-transient computer-readable medium of claim 15, wherein the instructions, when executed, cause the processor to:
enable generation of the interrupt responsive to a current value of the duty cycle register being greater than or equal to a current value of a period register; and
disable generation of the interrupt responsive to loading the duty cycle register.

17. The non-transient computer-readable medium of claim 15, wherein the instructions, when executed, cause the processor to:
load the duty cycle value into the duty cycle register using an immediate mode; and
after loading the duty cycle value into the duty cycle register, set the duty cycle register to operate in a shadow mode.

18. The non-transient computer-readable medium of claim 14, wherein the instructions, when executed, cause the processor to:
responsive to the duty cycle value being greater than or equal to the period value, load the duty cycle value into the duty cycle register.

19. The non-transient computer-readable medium of claim 14, wherein:
the PWM circuit is a first PWM circuit; and
the instructions, when executed, cause the processor to:
load the duty cycle value into the duty cycle register responsive to the value of a counter of a second PWM circuit being equal to zero.

20. A power factor correction (PFC) circuit, comprising:
a half-bridge circuit, including a high-side transistor and a low-side transistor;
a pulse width modulation (PWM) system including:
a PWM circuit having:
a first output coupled to the high-side transistor;
a second output coupled to the low-side transistor;
a counter;
a period register; and
a duty cycle register; and
a controller coupled to the PWM circuit, the controller configured to:
calculate a period value and a duty cycle value; and
load the duty cycle value into the duty cycle register responsive to a count value of the counter being equal to a value of the duty cycle register, and the duty cycle value being less than the period value.

21. The PFC circuit of claim 20, wherein the controller is configured to:
responsive to the duty cycle value being less than the period value, enable generation of an interrupt triggered by the count value of the counter being equal to the value of the duty cycle register; and
load the duty cycle value into the duty cycle register responsive to the interrupt.

22. The PFC circuit of claim 21, wherein the controller is configured to:
enable generation of the interrupt responsive to a current value of the duty cycle register being greater than or equal to a current value of the period register;
disable the interrupt responsive to loading the duty cycle register;
load the duty cycle value into the duty cycle register using an immediate mode; and
after loading the duty cycle value into the duty cycle register, set the duty cycle register to operate in a shadow mode.

23. The PFC circuit of claim 20, wherein the controller is configured to:
responsive to the duty cycle value being greater than or equal to the period value, load the duty cycle value into the duty cycle register.

24. The PFC circuit of claim 20, wherein:
the PWM circuit is a first PWM circuit; and
the PWM system includes a second PWM circuit having:
a counter; and
the controller is configured to load the duty cycle register responsive to the value of the counter of the second PWM circuit being zero.

* * * * *